US010755638B2

(12) United States Patent
Lo et al.

(10) Patent No.: US 10,755,638 B2
(45) Date of Patent: Aug. 25, 2020

(54) ORGANIC LIGHT-EMITTING DIODE DISPLAY WITH EXTERNAL COMPENSATION

(71) Applicant: Apple Inc., Cupertino, CA (US)

(72) Inventors: Cheuk Chi Lo, San Francisco, CA (US); Chin-Wei Lin, Cupertino, CA (US); Chun-Yao Huang, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/325,236

(22) PCT Filed: Aug. 10, 2017

(86) PCT No.: PCT/US2017/046356
§ 371 (c)(1),
(2) Date: Feb. 13, 2019

(87) PCT Pub. No.: WO2018/034944
PCT Pub. Date: Feb. 22, 2018

(65) Prior Publication Data
US 2019/0206321 A1    Jul. 4, 2019

Related U.S. Application Data

(60) Provisional application No. 62/375,650, filed on Aug. 16, 2016.

(51) Int. Cl.
*G09G 3/3233* (2016.01)
*G09G 3/3291* (2016.01)
*H01L 27/32* (2006.01)

(52) U.S. Cl.
CPC ......... *G09G 3/3233* (2013.01); *G09G 3/3291* (2013.01); *H01L 27/3276* (2013.01);
(Continued)

(58) Field of Classification Search
CPC .. G09G 3/3233; G09G 3/3241; G09G 3/3258; G09G 3/3283; G09G 3/3291;
(Continued)

(56) References Cited

U.S. PATENT DOCUMENTS 7,898,511 B2 *  3/2011 Yoo ...................... G09G 3/3233
                                                      345/204
9,189,992 B2 * 11/2015 Hwang ................ G09G 3/3233
(Continued)

FOREIGN PATENT DOCUMENTS

EP           2889861           7/2015

OTHER PUBLICATIONS

Yokoyama et al., A 2.78-in 1058-ppi Ultra-High-Resolution OLED Display Using CAAC-OS FETs, SID 2015 Digest, 4 pages.

*Primary Examiner* — Tom V Sheng
(74) *Attorney, Agent, or Firm* — Treyz Law Group, P.C.; Jason Tsai

(57) ABSTRACT

A display has rows and columns of pixels (22). A data line (Dn) in each column provides image data signals to the pixels of that column. Each row has first and second control lines (select[m], monitor[m]) coupled to the gates of first and second respective transistors (SE, MO) in each pixel. A third transistor in each pixel serves as a drive transistor (DR) and is coupled in series with a light-emitting diode (30) between positive and ground power supply voltages (VDD, VSS). A display driver circuitry in the display characterizes each of the light-emitting diodes in a column using the data line in an adjacent column from that light-emitting diode. Each of the drive transistors in a column is characterized using the data line in that column and the data line in an adjacent column.

16 Claims, 6 Drawing Sheets

(52) U.S. Cl.
CPC ............... *G09G 2300/0426* (2013.01); *G09G 2300/0439* (2013.01); *G09G 2300/0819* (2013.01); *G09G 2300/0866* (2013.01); *G09G 2310/06* (2013.01); *G09G 2320/0233* (2013.01); *G09G 2320/0285* (2013.01); *G09G 2320/0295* (2013.01); *G09G 2320/045* (2013.01); *G09G 2320/0693* (2013.01); *G09G 2330/026* (2013.01)

(58) Field of Classification Search
CPC ... G09G 2300/0426; G09G 2300/0439; G09G 2300/0819; G09G 2300/0866; G09G 2310/06; G09G 2320/0233; G09G 2320/0285; G09G 2320/0295; G09G 2320/043; G09G 2320/045; G09G 2320/0693; G09G 2330/026; H01L 27/3276
See application file for complete search history.

(56) References Cited

U.S. PATENT DOCUMENTS

| | | | | |
|---|---|---|---|---|
| 9,355,596 B2* | 5/2016 | Shin | | G09G 3/3275 |
| 9,779,666 B2* | 10/2017 | Kwon | | G09G 3/3233 |
| 9,805,648 B2* | 10/2017 | Kim | | G09G 3/3233 |
| 10,062,325 B2* | 8/2018 | Lee | | H01L 27/3265 |
| 10,062,327 B2* | 8/2018 | Tani | | G09G 3/3233 |
| 10,089,934 B2* | 10/2018 | Nam | | G09G 3/3233 |
| 10,147,354 B2* | 12/2018 | Kim | | G09G 3/3233 |
| 10,192,482 B2* | 1/2019 | Cai | | G09G 3/3258 |
| 10,453,909 B2* | 10/2019 | Li | | G09G 3/3225 |
| 2006/0214888 A1* | 9/2006 | Schneider | | G09G 3/3233 345/76 |
| 2007/0146247 A1* | 6/2007 | Huang | | G09G 3/3233 345/76 |
| 2007/0195020 A1* | 8/2007 | Nathan | | G09G 3/3233 345/76 |
| 2009/0027377 A1 | 1/2009 | Oh-Kyong et al. | | |
| 2009/0295422 A1 | 12/2009 | Hamer et al. | | |
| 2011/0130981 A1* | 6/2011 | Chaji | | G09G 3/3233 702/58 |
| 2012/0169704 A1 | 7/2012 | Ho-Ryun | | |
| 2013/0038589 A1* | 2/2013 | Tseng | | G09G 3/3233 345/211 |
| 2013/0147690 A1* | 6/2013 | Kim | | G09G 3/3233 345/76 |
| 2014/0347253 A1* | 11/2014 | Lee | | G09G 3/3233 345/76 |
| 2015/0179105 A1* | 6/2015 | Mizukoshi | | G09G 3/3266 345/76 |
| 2016/0267844 A1* | 9/2016 | Senda | | G09G 3/2018 |
| 2017/0330506 A1* | 11/2017 | Wu | | G09G 3/007 |
| 2017/0372663 A1* | 12/2017 | Wu | | G09G 3/3233 |

* cited by examiner

ORGANIC LIGHT-EMITTING DIODE DISPLAY WITH EXTERNAL COMPENSATION

This application claims priority to provisional patent application No. 62/375,650, filed on Aug. 16, 2016, which is hereby incorporated by reference herein in its entirety.

BACKGROUND

This relates generally to displays, and, more particularly, to displays with external compensation for pixel variations.

Displays such as organic light-emitting diode displays may be used to display images for users of cellular telephones, watches, computers, and other electronic equipment. Each pixel in an organic light-emitting diode display may have an organic light-emitting diode that emits light in response to an applied current. A drive transistor and other pixel circuitry may be used to control the applied current and thereby adjust pixel brightness.

If care is not taken, pixel variations can adversely affect display performance. For example, some of the pixels in an organic light-emitting diode display may experience drive transistor threshold voltage shifts and light-emitting diode aging effects that can make those pixels weak. This can lead to undesirable variations in the image light output from different portions of a display.

Internal or external pixel compensation schemes can be used to help avoid non-uniform display output. With internal schemes, additional pixel circuitry is provided in the pixels to perform compensation. This pixel circuitry can consume significant area on a display and may therefore limit the maximum numbers of pixels per inch that can be included in the display. With external schemes, pixel measurement circuitry is placed in peripheral portions of a pixel array. These schemes allow pixel density to be enhanced, but may be insufficiently flexible to measure desired pixel attributes for compensation.

SUMMARY

A display such as an organic light-emitting diode display may have an array of pixels organized in rows and columns. There may be a data line in each column for providing image data signals to the pixels of that column. Each row may have first and second control lines coupled to the gates of first and second respective transistors in each pixel. A third transistor in each pixel may serve as a drive transistor and may be coupled in series with the light-emitting diode of that pixel between positive and ground power supply voltages.

The display may have display driver circuitry. The display driver circuitry may be used to implement an external compensation scheme. During multipoint calibration operations, the display driver circuitry may characterize each of the light-emitting diodes in a column using the data line in an adjacent column from that light-emitting diode. Each of the drive transistors in a column may be characterized using the data line in that column and the data line in an adjacent column. Multipoint calibration operations may be performed during power up and power down sequences. Single-point calibration operations in which the drive transistors are characterized to monitor for threshold voltage shifts may be performed during normal display operation in which the display is displaying images for a user.

DETAILED DESCRIPTION

Figure 1:
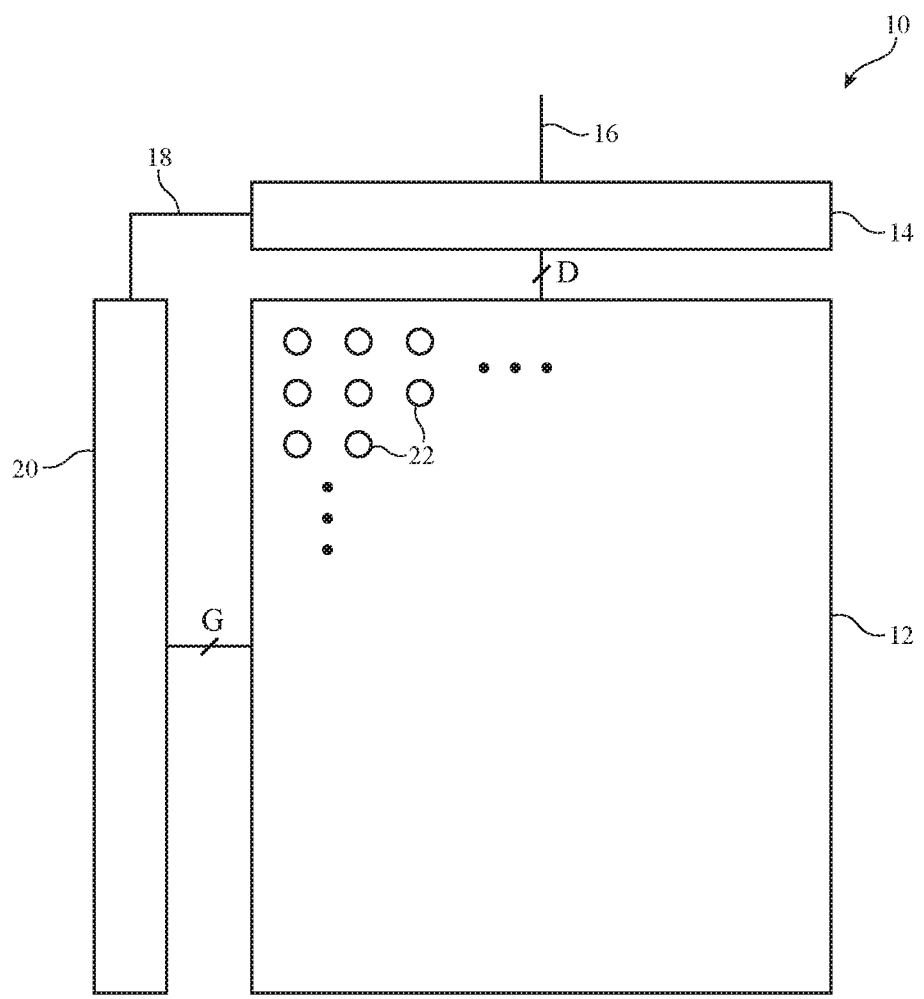
FIG. 1 is a diagram of an illustrative electronic device with a display in accordance with an embodiment.

FIG. 1 is a circuit diagram of an illustrative display. As shown in FIG. 1, display 10 may have display driver circuitry 14 that receives image data (e.g., serial image data) over path 16 from a data source (e.g., control circuitry in an electronic device associated with display 10, etc.). Images corresponding to the image data received on path 16 may be displayed on pixel array 12. Pixel array 12 may be formed from rows and columns of pixels 22. Pixels 22 may be organic light-emitting diode pixels or pixels containing micro-light-emitting diodes (e.g., individual crystalline semiconductor dies containing light-emitting diodes). Illustrative configurations in which pixels 22 are organic light-emitting diodes may sometimes be described herein as an example.

Display driver circuitry 14 may include digital-to-analog converter circuitry for converting digital image data from path 16 into analog image data signals and may include column buffer circuitry (sometimes referred to as column driver circuitry or data line driver circuitry) that drives the analog data signals into pixel array 12 for loading into pixels 22. Control signals may be supplied by display driver circuitry 14 to other display driver circuitry in display 10 such as gate line driver circuitry 20 using paths such as path 18. There may be gate line driver circuitry such as gate driver circuitry 20 on one or both edges of display 14.

During operation, display driver circuitry 14 may supply image data to pixel array 12 as data signals on data lines D while directing gate drive circuitry 20 to supply rows of pixels 22 with control signals on gate lines G. There may be any suitable number of gate lines G per row of pixels 22. For example, there may be two gate lines (control lines) G per row. There may be a single data line D per column of pixels 22. Pixels 22 may include red, green, and blue pixels and/or pixels of other colors to provide display 10 with the ability to display color images.

Figure 2:
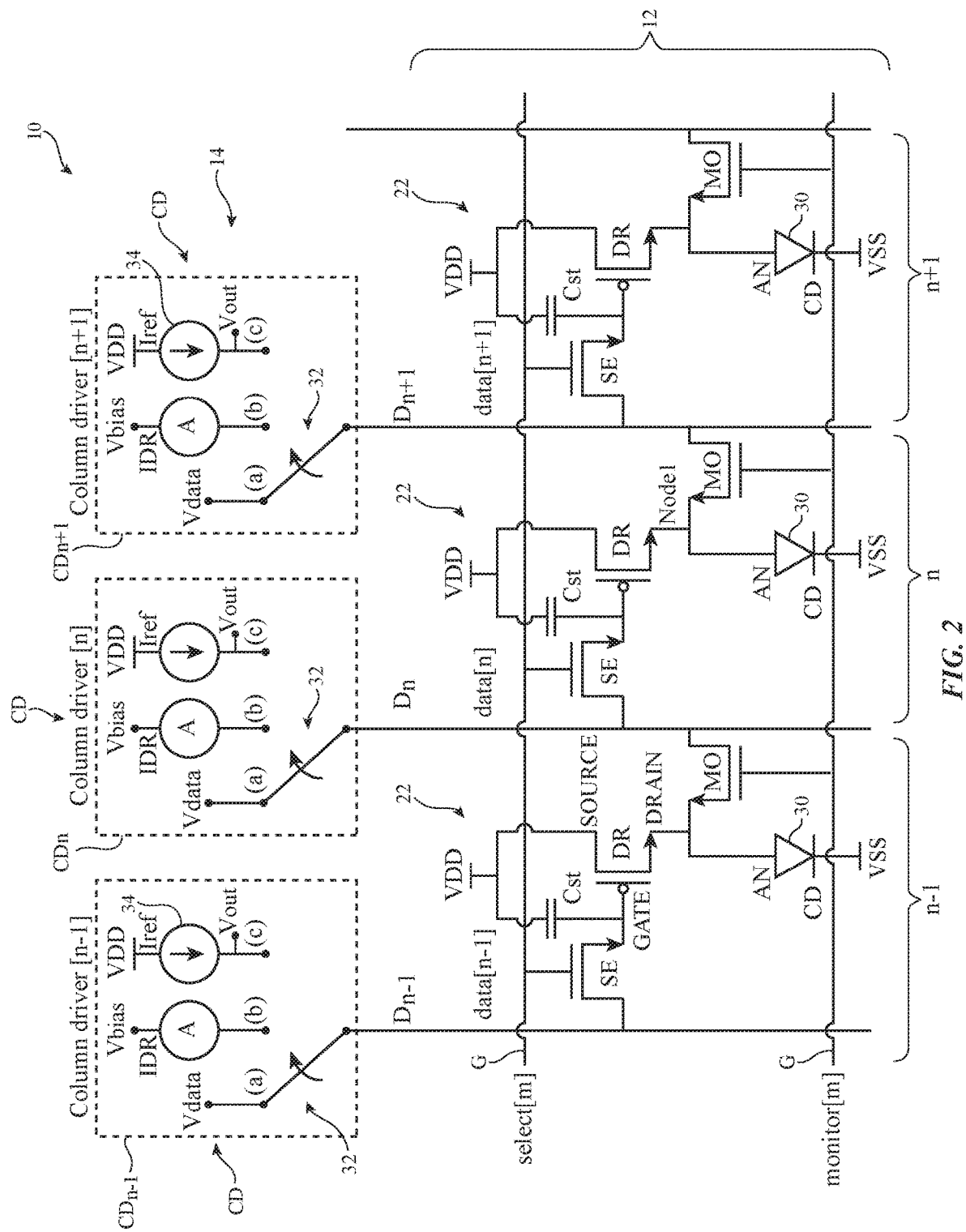
FIG. 2 is a diagram of illustrative pixels and associated display driver circuitry in accordance with an embodiment.

To compensate pixels 22 for performance variations due to manufacturing variations and/or aging effects, display 10 may include circuitry of the type shown in FIG. 2. As shown in FIG. 2, display 10 may have display driver circuitry 14 that includes a column driver circuit for each column of pixels 22 in array 12. For example, column driver CDn−1 may be associate with column n−1, column driver CDn may be associated with column n, and column driver Cn+1 may be associated with column n+1.

Each row of pixels 22 in pixel array 12 may have a pair of associated gate lines G. Gate lines G may be used to receive control signals from gate driver circuitry 20 (FIG. 1). In the example of FIG. 2, pixels 22 are associated with row m of array 12 and gate lines G are being used to convey control signals select(m) and monitor(m) to pixels 22. Control signal select(m) is used to control transistors SE (sometimes referred to as "line select" transistors). Control signal monitor(m) may be used to control transistors MO (sometimes referred to as "monitor" transistors).

Each pixel 22 has a respective organic light-emitting diode 30 and a drive transistor DR that controls application of drive current through that light-emitting diode. Drive transistors DR are each coupled in series with a respective light-emitting diode between positive power supply terminal Vdd and ground power supply terminal Vss. If desired, pixels 22 may have an inverted-stacked organic light-emitting diode configuration in which anode AN of each diode 30 is coupled to positive power supply terminal Vdd and in which drive transistor DR is coupled between ground power supply terminal Vss and the cathode CD of that diode 30 (i.e., a configuration in which drive transistor DR and diode 30 are coupled in series between positive power supply Vdd and ground power supply Vss, but with drive transistor DR and diode 30 reversed from the orientation shown in FIG. 2). The configuration of FIG. 2 in which cathodes CD of diodes 30 are coupled to ground terminal Vss and in which drive transistors DR are coupled to positive power supply terminal Vdd is merely illustrative.

Pixels 22 may include storage capacitors Cst for storing data that is loaded into pixels 22 via data lines D. Each storage capacitor Cst may, as an example, have a first terminal coupled to a gate terminal of drive transistor DR and a second terminal coupled to positive power supply terminal Vdd. During data loading, select(m) is taken high to turn on transistors SE so that data lines D may convey data signals to respective storage capacitors Cst through transistors SE. The magnitude of the data signal loaded onto each storage capacitor Cst controls the gate voltage Vg on the corresponding gate of drive transistor DR. The gate voltage Vg on the gate of drive transistor DR in a given pixel 22 controls the current flowing between the drain-source terminals of drive transistor DR and therefore the current flowing from terminal Vdd to terminal Vss through light-emitting diode 30 and the corresponding luminance of pixel 22.

During calibration operations, the display driver circuitry of display 10 is configured to measure the behavior of the drive transistor and the behavior of the light-emitting diode in each pixel 22. This information can then be processed and used to maintain a frame of calibration data in the display driver circuitry. During normal operation, when displaying a frame of image data on display 10, the frame of calibration data may be applied to the frame of image data to calibrate the frame of image data. For example, if some of the pixels 22 in array 12 are found to have weak drive transistors and/or weak light-emitting diodes, the calibration data associated with those pixels may compensate accordingly (e.g., by increasing the value of the data loaded into those pixels by an appropriate corrective amount).

Satisfactory calibration (compensation) of the pixels 22 in array 12 may be performed by selectively configuring the transistors of each pixel 22 to couple the display driver circuitry of display 10 to each of the three terminals of drive transistors DR (to characterize drive transistors DR) and to each of the two terminals of light-emitting diodes 30 (to characterize light-emitting diodes 30). Column driver circuitry CD and gate driver circuitry in the display driver circuitry may be dynamically configured to independently characterize transistors DR and light-emitting diodes 30, so that these measurements can be used to calibrate array 12.

As shown in FIG. 2, each column driver CD may include switching circuitry such as switch (multiplexer) 32. In each column, switch 32 has may be coupled between the data line D of that column and one of three possible nodes: node (a), node (b), or node (c). Node (a) is coupled to a voltage source that produces data signals for lines D (e.g., analog image data signal Vdata). Node (b) is coupled to a voltage source that produces a bias voltage Vbias via current source A. Current sensor (ammeter) A measures current Idr through node (b). Node (c) is coupled to positive power supply Vdd via reference current source 34. Reference current source 34 supplies reference current Iref. The column driver circuitry measures voltage Vout that is produced at node (c) in response to supplying reference current Iref with current source 34.

Figure 3:
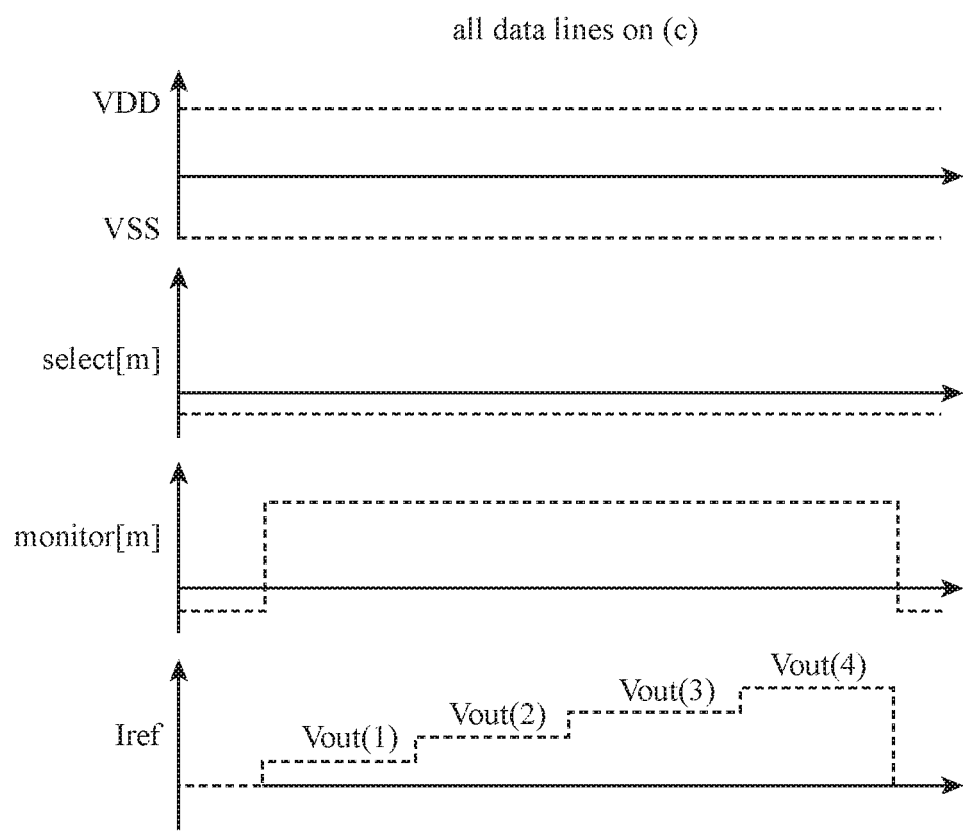
FIGS. 3, 4, and 5 are timing diagrams showing illustrative signals involved in performing compensation operations in accordance with an embodiment.

FIG. 3 shows how the display driver circuitry of display 10 may apply signals to pixels 22 to characterize the light-emitting diodes 30 of those pixels 22. During light-emitting diode characterization operations, the current-voltage characteristic of each diode 30 may be measured. For example, diodes 30 may each be characterized at a number of different bias points (e.g., four bias points, fewer than four bias points, more than four bias points, etc.). In the example of FIG. 3, data for four different bias points is measured. Configurations in which measurements are made a multiple bias points may sometimes be referred to herein as multi-point calibration techniques.

The light-emitting diodes 30 of entire rows of pixels 22 may be characterized at the same time. As shown in FIG. 3, voltage Vdd may be taken high to a positive power supply voltage and voltage Vss may be taken low to a ground power supply voltage. Select(m) in a given row (row m) may be taken low to turn off transistors SE in that row. Monitor(m) in row m may be taken high to turn on transistors MO in row m. In each column, the light-emitting diode of that column can be characterized by applying a current to that light-emitting diode through the data line of the next (adjacent) column. In particular, switch 32 in each adjacent column may be coupled to node (c) so that series of reference currents Iref may applied to the light-emitting diode 30 via the transistor MO in the column containing the light-emitting diode. As each of the reference currents Iref is applied, a corresponding resulting voltage Vout across diode 30 may be measured at the Vout terminal coupled to node (c) in the adjacent column. There are four different reference currents Iref and four resulting voltage Vout(1), Vout(2), Vout(3), and Vout(4) in the FIG. 3 example, but diode measurements may be taken for more bias points or fewer bias points if desired. The current and voltage measurements may be processed to characterize the current versus voltage behavior of each diode 30.

The voltage Vout that is measured during each of the measurements of FIG. 3 (e.g., each of the four diode bias points) corresponds to the voltage at anode AN. Anode AN is coupled to the drain terminal of drive transistor DR, so each of the Vout measurements of FIG. 3 may be associated with a corresponding drain voltage Vd. When drive transistor DR is controlled so as to produce a voltage Vd at its drain that is equal to one of the measured Vout values, diode 30 will produce a corresponding current known current (the previously applied reference current associated with that Vout value). For example, if voltage Vout(3) is measured at terminal Vout when current Iref(3) is applied to diode 30 during light-emitting diode characterization operations, then drive transistor DR can drive current Iref(3) through diode 30 by producing a voltage Vd at its drain that is equal to voltage Vout(3). During drive transistor calibration operations, the magnitude of gate voltage Vg that is needed at the gate of each drive transistor to produce a given Vd value at that transistor's drain is determined. Knowing the gate voltage Vg needed to produce each drain voltage Vd (from transistor characterization operations) and knowing the amount of drain voltage Vd needed to produce a given diode current through diode 30 (from diode characterization operations), the display driver circuitry can produce a frame of calibration data containing calibration data for each of pixels 22.

Figure 4:
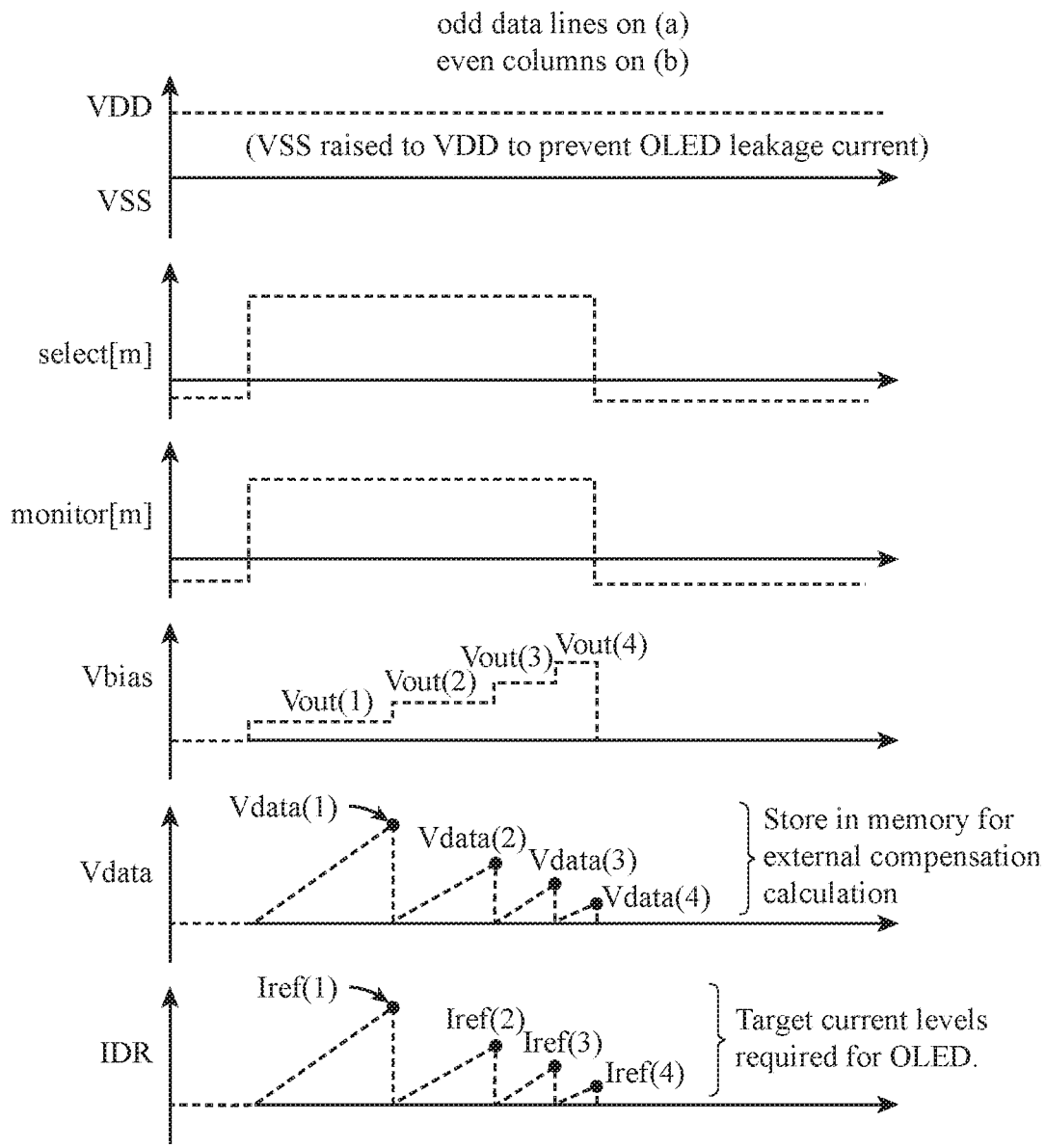

FIG. 4 shows how drive transistors DR can be characterized using measurements at multiple bias points. Half of the transistors DR in each row may be characterized at the same time. For example, the odd pixels 22 of each row in array 12 may be characterized during an initial set of characterization operations (e.g., one row at a time) and, following odd pixel characterization, the even pixels 22 of each row in array 12 may be characterized (e.g., one row at a time).

As shown in FIG. 4, positive terminals Vdd may be held high at a positive power supply during drive transistor characterization operations. Ground terminal Vss may be temporarily raised to the same positive voltage to turn off diodes 30 and prevent leakage through diodes 30. To characterize drive transistor DR in column n, control signal monitor(m) is taken high to turn on transistors MO in row m. In column driver CNn of column n, switch 32 couples data line n to node (a) so that the display driver circuitry can supply various voltages Vdata to the gate of drive transistor DR via transistor SE in column n. In adjacent column n+1, switch 32 of column driver CDn+1 is coupled to node (b). While current sensor A of column driver CDn+1 measures current Idr flowing through data line n+1, bias voltage Vbias is taken to a series of known bias voltages. In particular, column driver CDn+1 supplies each of the previously measured bias point drain voltages that were gathered during the operations of FIG. 3 (i.e., voltages Vout(1) ... Vout(4)) to the drain of transistor DR. At each of these applied drain voltages Vout(1) ... Vout(4), the value of Vdata that is being applied to the gate of transistor DR in column n by column driver CDn over data line n is adjusted (e.g., ramped as shown in FIG. 4) until the measured value of Idr from current sensor A in column driver CDn is equal to the previously measured Iref value for that drain voltage (i.e., the Iref values for Vout(1) ... Vout(4) that were measured during the operations of FIG. 3).

Because two data lines are used in characterizing the drive transistor DR in each column (i.e., data line n and data line n+1 in this example), only half of the pixels 22 in each row may be characterized at the same time. After the characterization operations are performed for the pixels in each of the odd columns, the process may be repeated for the even columns of array 12. These measurements inform the display driver circuitry of the values of gate voltages Vg that will produce drain voltages Vout(1) ... Vout(4). The measurements of FIG. 3 inform the display driver circuitry of the values of the light-emitting diode currents that are produced for applied drain voltages Vout(1) ... Vout(4). The multipoint measurements of FIGS. 3 and 4 therefore result in a Vg to diode current mapping that characterizes both the light-emitting diodes 30 and drive transistors DR of array 12 and allows a frame of corresponding compensation data (calibration data) to be produced and stored in display driver circuitry 14. During normal operation of display 10, display driver circuitry 14 can apply this calibration frame to the data of the image frames being received over path 16, so that the corresponding image frames that are displayed on pixel array 12 by the display driver circuitry are satisfactorily compensated for variations in the performance of drive transistors DR (e.g., threshold voltage variations) and light-emitting diodes 30 (e.g., the current versus voltage characteristics of diodes 30).

The multipoint calibration operations of FIGS. 3 and 4 may consume more time than is available within an image frame. Accordingly, multipoint operations of the types show in FIGS. 3 and 4 may be performed at times when more calibration time is available such as at power up and/or at power down. To ensure that the performance of pixels 22 does not drift excessively between power up/down events, periodic single-point transistor calibration operations can be performed. During these single-point calibration operations, threshold voltage shifts in transistors DR can be measured. Measurement time may be relatively short, so at least one of the periodic single-point transistor calibration operations can be incorporated into each frame (or nearly each frame) being displayed (e.g., in a brief time interval at the beginning of each frame, etc.).

To ensure that single-point transistor characterization measurements are sufficiently short, only a single half row (odd or even pixels) can be characterized at each time. Over hundreds or thousands of frames, the display driver circuitry can step through the pixels in all of the rows of array 12, so that all of array 12 can be characterized. This transistor characterization information may then used to update the calibration data in the calibration frame stored in display driver circuitry 14.

Figure 5:
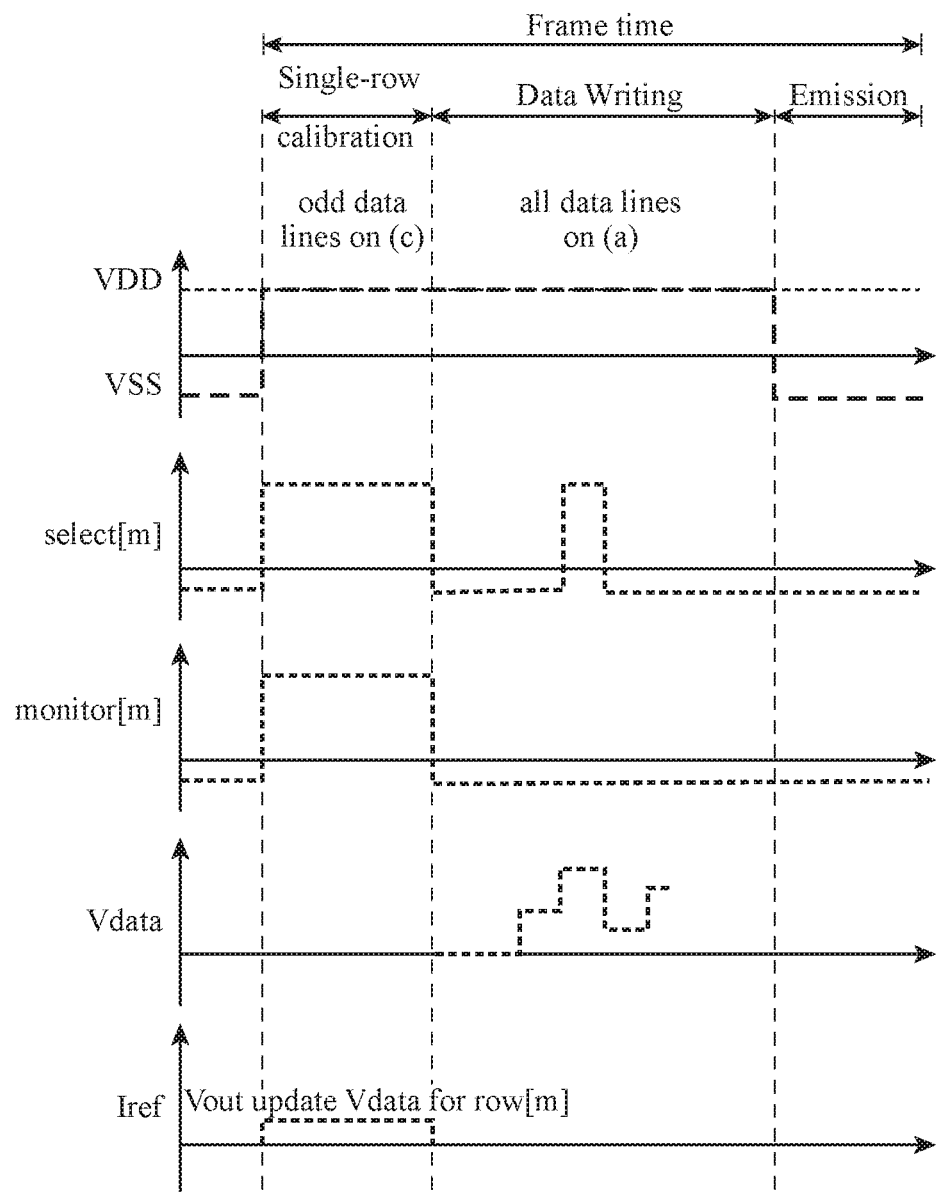

During each single-point characterization of drive transistors DR, drive transistors DR are diode connected (Vd=Vg). Single-point calibration operations may occur during time period "single-row" in FIG. 5. During this time period, Vdd is high and Vss is temporarily set high to turn off diodes 30 in row m. Select(m) and monitor(m) are taken high to turn on transistors SE and MO. In column n, column driver CDn couples switch 32 to node (a), so Vdata is applied to the gate of transistor DR. In column n+1, column driver CDn+1 couples switch 32 to node (c). This couples current source 34 (producing current Iref) to the drain of transistor DR. The value of Iref is set to a known value Irefk. Irefk is forced through transistor DR from the drain of transistor DR to the source of transistor DR. The forced current Irefk causes the drain voltage Vd to go to a value Vdout, which is measured at terminal Vout. Column driver CDn applies the same voltage Vdout to the gate of transistor DR (as Vdata) using data line n to place transistor DR in a diode connected configuration (Vg=Vd). Knowing Irefk and Vdout for diode-connected transistor DR, the display driver circuitry may compute the threshold voltage Vt of drive transistor DR. This information may then be used to update the frame of calibration data stored in display driver circuitry 12. Following calibration of the odd (or even) pixels of one of the rows of array 12, image data may be loaded (during the "data writing" phase of FIG. 5) and pixels 22 may be used to emit light (e.g., during the normal display operating mode "emission" of FIG. 5). To ensure that all transistors DR are characterized using the single-point calibration technique, the process of FIG. 5 may be repeated for each row of array 10 for both odd and even pixel sets. Diodes 30 need not be characterized during the single-point drive transistor characterization operations of FIG. 5 and can be characterized during power on and/or power off calibration operations of the type described in connection with FIGS. 3 and 4.

Figure 6:
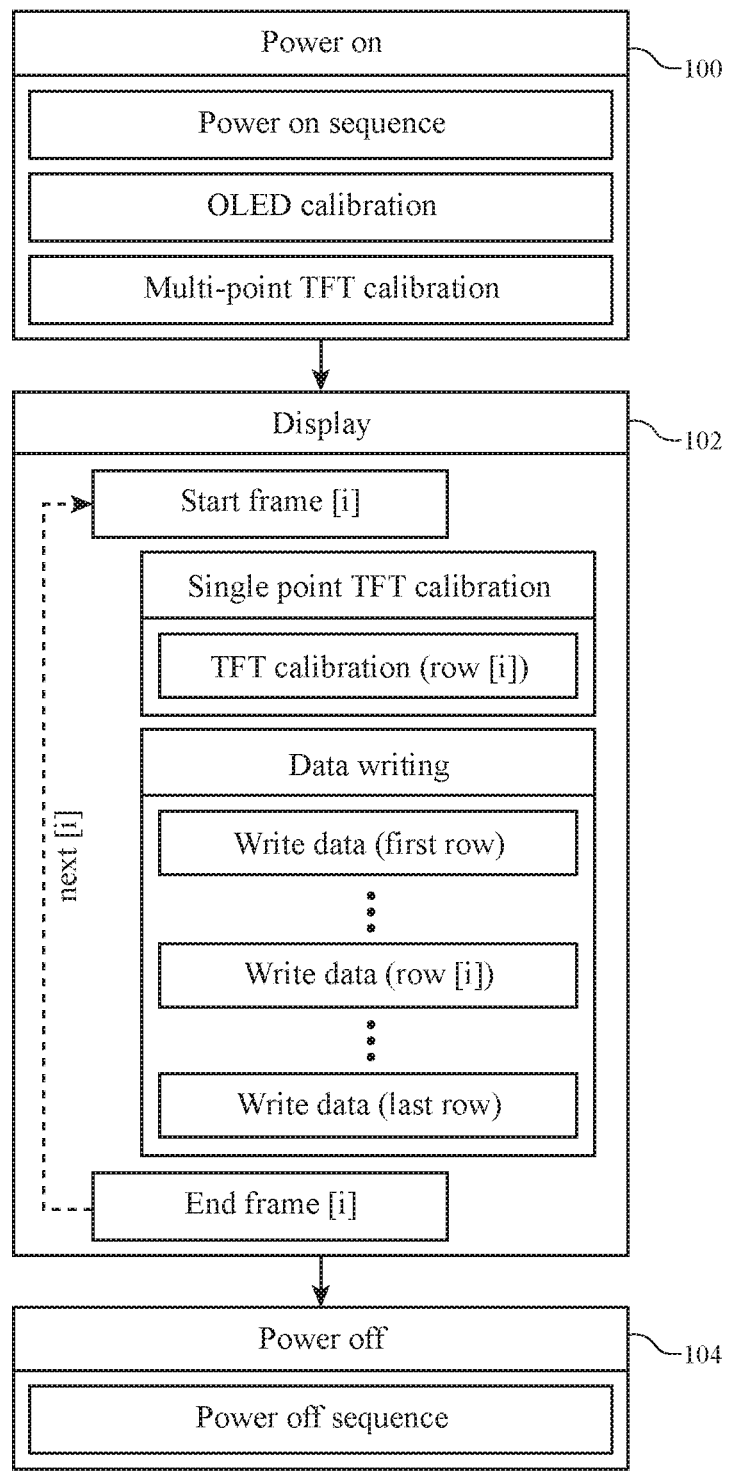
FIG. 6 is a flow chart of illustrative operations involved in calibrating and using a display in an electronic device in accordance with an embodiment.

FIG. 6 is a flow chart of illustrative operations involved in using display 10 of FIG. 1. At step 100, display 10 may be powered on. Following a power-on sequence in which the circuitry of display 10 is powered with power supply voltages Vdd and Vss, multipoint organic light-emitting diode characterization operations of the type shown in FIG. 3 may be performed and multipoint drive transistor characterization operations of the type shown in FIG. 4 may be performed. Calibration data (e.g., a frame of calibration data that includes compensation information for each pixel 22 of array 12) may be saved in display driver circuitry 14 and/or previous calibration data may be updated based on the multipoint characterization results.

During the operations of step 102, display 102 may be operated normally and may display image frames on pixel array 12 based on image data received over path 16. As described in connection with FIG. 5, each frame may include a short period of time (the "single-row" period from FIG. 5) during which half of a row (odd or even) of pixels 22 may be calibrated using a single-point drive transistor characterization process. Data may then be written into each of the rows of pixels 22 and a desired frame of image data displayed for a user, before looping back to characterize another half of a row (odd or even) of pixels 22. By repeatedly performing these single-point drive transistor characterization operations, threshold voltage shifts in drive transistors DR may be tracked and used to update the calibration data in display driver circuitry 14. Power-off operations may be performed during step 104. If desired, multipoint light-emitting diode and multipoint drive transistor characterization operations may be performed before performing a power off sequence that shuts down power to display 10.

In accordance with an embodiment a display is provided that includes a positive power supply terminal, a ground power supply terminal, an array of pixels having rows and columns, first and second control lines in each row, a data line associated with each column, the pixel in each row and column includes, a light-emitting diode having terminals, a drive transistor coupled in series with the light-emitting diode between the positive power supply terminal and the ground power supply terminal, a first transistor that is coupled between the data line of the column and the gate of the drive transistor and that has a gate coupled to the first control line of the row, and a second transistor that is coupled between the data line of an adjacent and one of the terminals of the diode and that has a gate coupled to the second control line of the row, and display driver circuitry configured to, characterize the light-emitting diode in each column without using any data lines in that column and using the data line in an adjacent column, and characterize the drive transistors in each column using the data line in that column and using the data line in an adjacent column.

In accordance with another embodiment, the display driver circuitry is configured to characterize the light-emitting diode in each column using multipoint measurements.

In accordance with another embodiment, the display driver circuitry is configured to characterize the drive transistor in each column using multipoint measurements.

In accordance with another embodiment, the display includes a column driver in each column that includes a switch coupled to the data line in that column.

In accordance with another embodiment, each column driver includes a current sensor that is coupled to the switch in that column driver.

In accordance with another embodiment, the display includes a voltage bias source in each column driver that is coupled to the switch, the current sensor coupled to the switch in each column driver is coupled between the voltage bias source and the switch in that column driver.

In accordance with another embodiment, each column driver includes a current source coupled to the switch in that column driver.

In accordance with another embodiment, each column driver is configured to measure an output voltage at an output voltage sensing node coupled between the current source of that column driver and the switch of that column driver.

In accordance with another embodiment, each column driver includes a voltage source that is coupled to the switch in that column driver and that is configured to supply analog image data signals to the switch in that column driver.

In accordance with another embodiment, each pixel includes a storage capacitor and contains fewer than four transistors.

In accordance with an embodiment, a display is provided that includes an array of pixels having rows and columns, each pixel including a light-emitting diode, first, second, and third transistors, and a storage capacitor, the first transistor and light-emitting diode in each pixel are coupled in series between a positive power supply and a ground power supply, data lines associated with the array of pixels, each column contains a single respective data line, and display driver circuitry configured to characterize the light-emitting diodes in the pixels of each column using the data line in an adjacent column, characterize the first transistors in the pixels of each column using the data line in that column and the data line in an adjacent column.

In accordance with another embodiment, the display driver circuitry includes a column driver circuit in each column having a switch coupled to the data line in that column.

In accordance with another embodiment, the column driver circuit of each column has a current sensor coupled to the switch of that column driver circuit.

In accordance with another embodiment, the column driver circuit of each column is configured to supply a bias voltage to the switch through the current sensor and is configured to supply image data voltage signals to the switch.

In accordance with another embodiment, the column driver circuit of each column includes a current source coupled to the switch.

In accordance with an embodiment, a method of operating a display having an array of pixels and display driver circuitry is provided that includes with the display driver circuitry, performing multipoint light-emitting diode and drive transistor calibration operations on light-emitting diodes and drive transistors in the array of pixels, storing a frame of calibration data in the display driver circuitry based on the multipoint light-emitting diode and drive transistor calibration operations, and during normal operations in which images are being displayed on the array of pixels by the display driver circuitry, using the display driver circuitry to perform single-point calibration operations on the drive transistors to update the stored frame of calibration data.

In accordance with another embodiment, the array has rows and columns of the pixels, each of the pixels includes a respective one of the light-emitting diodes and a respective one of the drive transistors, each column includes a single data line, and performing the multipoint light-emitting diode and drive transistor calibration operations includes with the display driver circuitry, characterizing the light-emitting diode in each column using the data line in an adjacent column and no other data lines.

In accordance with another embodiment, performing the multipoint light-emitting diode and drive transistor calibration operations includes with the display driver circuitry, characterizing the thin-film transistor in each column using the data line in that column and using the data line in an adjacent column.

In accordance with another embodiment, characterizing the thin-film transistor in each column includes applying voltages to a gate of the drive transistor using the data line in that column and applying voltages to a drain of the drive transistor using the data line in the adjacent column.

In accordance with another embodiment, characterizing the light-emitting diode in each column includes applying a current to that light-emitting diode while measuring a resulting voltage using the data line in the adjacent column.

The foregoing is merely illustrative and various modifications can be made to the described embodiments. The foregoing embodiments may be implemented individually or in any combination.

What is claimed is:

1. A display, comprising:
  a positive power supply terminal;
  a ground power supply terminal;
  an array of pixels having rows and columns;
  first and second control lines in each row;
  a data line associated with each column, wherein the pixel in each row and column includes:
    a light-emitting diode having terminals;
    a drive transistor coupled in series with the light-emitting diode between the positive power supply terminal and the ground power supply terminal;
    a first transistor that is coupled between the data line of the column and a gate of the drive transistor and that has a gate coupled to the first control line of the row; and
    a second transistor that is coupled between the data line of an adjacent and one of the terminals of the diode and that has a gate coupled to the second control line of the row; and
  display driver circuitry configured to:
    characterize the light-emitting diode in each column without using any data lines in that column and using the data line in an adjacent column by obtaining multipoint measurements at a plurality of different bias levels; and
    characterize the drive transistors in each column using the data line in that column and using the data line in an adjacent column.

2. The display defined in claim 1 wherein the display driver circuitry is configured to characterize the drive transistor in each column using multipoint measurements.

3. The display defined in claim 1 further comprising a column driver in each column that includes a switch coupled to the data line in that column.

4. The display defined in claim 3 wherein each column driver includes a current sensor that is coupled to the switch in that column driver.

5. The display defined in claim 4 further comprising a voltage bias source in each column driver that is coupled to the switch, wherein the current sensor coupled to the switch in each column driver is coupled between the voltage bias source and the switch in that column driver.

6. The display defined in claim 5 wherein each column driver includes a current source coupled to the switch in that column driver.

7. The display defined in claim 6 wherein each column driver is configured to measure an output voltage at an output voltage sensing node coupled between the current source of that column driver and the switch of that column driver.

8. The display defined in claim 7 wherein each column driver includes a voltage source that is coupled to the switch in that column driver and that is configured to supply analog image data signals to the switch in that column driver.

9. The display defined in claim 1 wherein each pixel includes a storage capacitor and contains fewer than four transistors.

10. A display comprising:
  an array of pixels having rows and columns, each pixel including a light-emitting diode, first, second, and third transistors, and a storage capacitor, wherein the first transistor and light-emitting diode in each pixel are coupled in series between a positive power supply and a ground power supply;
  data lines associated with the array of pixels, wherein each column contains a single respective data line; and
  display driver circuitry configured to:
    characterize the light-emitting diodes in the pixels of each column using the data line in an adjacent column;
    characterize the first transistors in the pixels of each column using the data line in that column and the data line in an adjacent column, wherein the display driver circuitry comprises a column driver circuit in each column having a switch coupled to the data line in that column, wherein the column driver circuit of each column has a current sensor coupled to the switch of that column driver circuit, and wherein the column driver circuit of each column is configured to supply a bias voltage to the switch through the current sensor and is configured to supply image data voltage signals to the switch.

11. The display defined in claim 10 wherein the column driver circuit of each column includes a current source coupled to the switch.

12. A method of operating a display having an array of pixels and display driver circuitry, comprising:
  with the display driver circuitry, performing multipoint light-emitting diode and drive transistor calibration operations at multiple reference levels on light-emitting diodes and drive transistors in the array of pixels;
  storing a frame of calibration data in the display driver circuitry based on the multipoint light-emitting diode and drive transistor calibration operations; and
  during normal operations in which images are being displayed on the array of pixels by the display driver circuitry, using the display driver circuitry to perform single-point calibration operations at a single reference level on the drive transistors to update the stored frame of calibration data.

13. The method defined in claim 12 wherein the array has rows and columns of the pixels, wherein each of the pixels includes a respective one of the light-emitting diodes and a respective one of the drive transistors, wherein each column includes a single data line, and wherein performing the multipoint light-emitting diode and drive transistor calibration operations comprises:
  with the display driver circuitry, characterizing the light-emitting diode in each column using the data line in an adjacent column and no other data lines.

14. The method defined in claim 13 wherein performing the multipoint light-emitting diode and drive transistor calibration operations comprises:
  with the display driver circuitry, characterizing the drive transistor in each column using the data line in that column and using the data line in an adjacent column.

15. The method defined in claim 14 wherein characterizing the drive transistor in each column comprises applying voltages to a gate of the drive transistor using the data line in that column and applying voltages to a drain of the drive transistor using the data line in the adjacent column.

16. The method defined in claim 14 wherein characterizing the light-emitting diode in each column comprises applying a current to that light-emitting diode while measuring a resulting voltage using the data line in the adjacent column.

\* \* \* \* \*